(12) United States Patent
Woo et al.

(10) Patent No.: US 8,423,706 B2
(45) Date of Patent: Apr. 16, 2013

(54) APPARATUS AND METHOD TO PREVENT DATA LOSS IN NONVOLATILE MEMORY

(75) Inventors: Kyoung-Gu Woo, Seoul (KR); Ki-Yong Lee, Yongin-si (KR); Hee-Seon Park, Seoul (KR); In-Sun Kang, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 1291 days.

(21) Appl. No.: 12/164,462

(22) Filed: Jun. 30, 2008

(65) Prior Publication Data

US 2009/0013139 A1 Jan. 8, 2009

(30) Foreign Application Priority Data

Jul. 4, 2007 (KR) .................. 10-2007-0067075

(51) Int. Cl.
*G06F 12/00* (2006.01)
(52) U.S. Cl.
USPC ........................................... 711/103
(58) Field of Classification Search .................. None
See application file for complete search history.

(56) References Cited

U.S. PATENT DOCUMENTS

| 6,347,051 B2 * | 2/2002 | Yamagami et al. ...... 365/185.09 |
| 2004/0128470 A1 | 7/2004 | Hetzler et al. |
| 2006/0161725 A1 * | 7/2006 | Lee et al. ...................... 711/103 |
| 2006/0259718 A1 * | 11/2006 | Paley ............................ 711/159 |
| 2007/0011581 A1 * | 1/2007 | Nakanishi et al. ............ 714/768 |
| 2008/0074928 A1 * | 3/2008 | Choi ........................ 365/185.17 |
| 2008/0177934 A1 * | 7/2008 | Yu et al. ........................ 711/103 |

FOREIGN PATENT DOCUMENTS

| CN | 1866399 A | 11/2006 |
| KR | 10-2002-0092487 A | 12/2002 |
| KR | 10-2006-0021548 A | 3/2006 |
| KR | 10-2007-008899 A | 1/2007 |

OTHER PUBLICATIONS

Bauer, M. et al. "A Multilevel-Cell 32Mb Flash Memory." ISSCC95, Session 7, Flash Memory, Paper TA 7.7. Feb. 16, 1995. p. 132-133, 351.
Chinese Office Action dated May 16, 2012 issued in counterpart Chinese Patent Application No. 200810128107.

* cited by examiner

*Primary Examiner* — Tuan Thai
*Assistant Examiner* — Daniel Tsui
(74) *Attorney, Agent, or Firm* — Sughrue Mion, PLLC

(57) ABSTRACT

An apparatus for preventing data loss of a nonvolatile memory device and a method thereof are presented The apparatus includes a nonvolatile memory including a memory cell which writes bit information to a first page and a second page included in a first block using plural states which are implemented using at least 2 bits, and a data-processing unit which writes the bit information of the first page to a second block in the nonvolatile memory while the bit information is written to the second page after the bit information is written to the first page.

20 Claims, 7 Drawing Sheets

APPARATUS AND METHOD TO PREVENT DATA LOSS IN NONVOLATILE MEMORY

CROSS REFERENCE TO RELATED APPLICATION

This application claims priority from Korean Patent Application No. 10-2007-0067075 filed on Jul. 4, 2007, in the Korean Intellectual Property Office, the disclosure of which is incorporated herein by reference in its entirety.

BACKGROUND OF THE INVENTION

1. Field of the Invention

Apparatuses and methods consistent with the present invention relate to preventing data loss of a nonvolatile memory device, and more particularly, to a nonvolatile memory that can represent bit information of multiple pages using one memory cell.

2. Description of the Related Art

In general, nonvolatile memories are widely used as a storage device to store and process data in embedded systems, including appliance devices, communication devices, and set-top boxes.

Flash memory, a commonly used nonvolatile memory, can delete and rewrite data electrically, and can be easily adapted to portable devices since it has a lower power consumption compared to magnetic disk storage devices, a fast access time similar to that of a hard disk, and a small footprint.

The basic mechanism to store data bits in such a nonvolatile memory is a memory cell. Such a memory cell is composed of a unit field effect transistor including a control gate, a floating gate, a source, and a drain. In this case, a data bit can be stored by changing the capacitance of the floating gate to change the threshold voltage of the memory cell. Also, the memory cell is decoded by applying a selection voltage through the word line of the control gate.

A typical memory cell provides storage capacity by storing two states using one bit. Specifically, "1" denotes deletion and "0" denotes written.

A technique to significantly reduce the price per bit for nonvolatile memories was published in the article "A Multi-level-Cell 32 Mb Flash Memory" by M. Bauer in ISSCC Digest of Technical Papers, pp. 132-133, February, 1995. This publication includes a technique storing four states using two bits per memory cell.

As described above, a nonvolatile memory having capacity for storing four states using two bits per memory cell is typically called an MLC (Multi-Level Cell), and data bits for two pages are stored using one memory cell. Also, each of the two pages corresponding to one memory cell is called an LSB (Least Significant Bit) page and an MSB (Most Significant Bit) page respectively, and data bits are stored starting from the LSB page. For example, a two level MLC flash memory implements four states including 00, 01, 10, and 11 using 2 bits.

Figure 1:
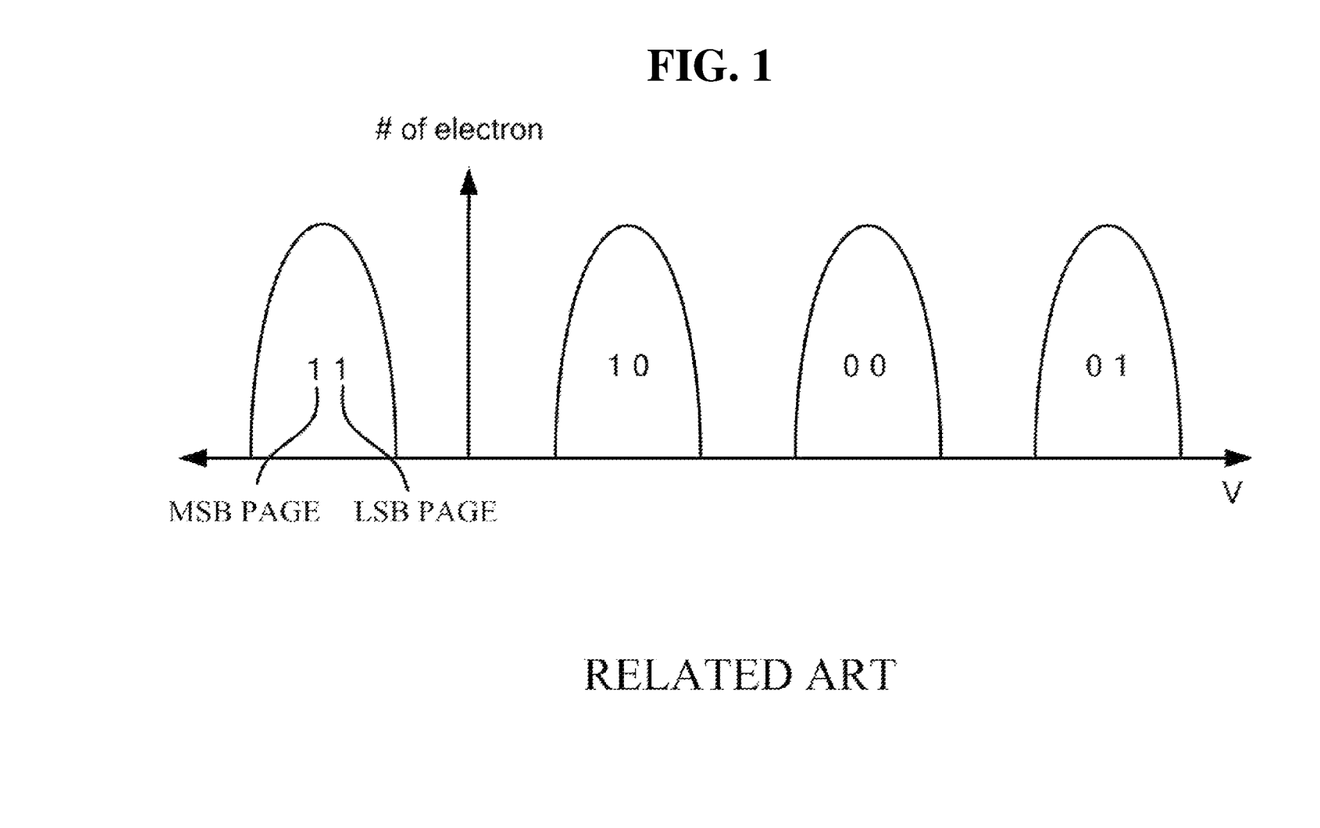
FIG. 1 is a graph illustrating states of a related art two level MLC nonvolatile memory.

FIG. 1 is a graph illustrating states of a related art two level MLC nonvolatile memory.

As shown in FIG. 1, the typical 2 level MLC flash memory has an initial state of 11 and the state changes 10 to 00 to 10 in order as the voltage is increased. Thus, in order to make a state of 01 from a state of 11, state sequence 11 to 10 to 00 has to be followed. Also, in each state an upper bit indicates the MSB page and a lower bit indicates the LSB page.

Figure 2:
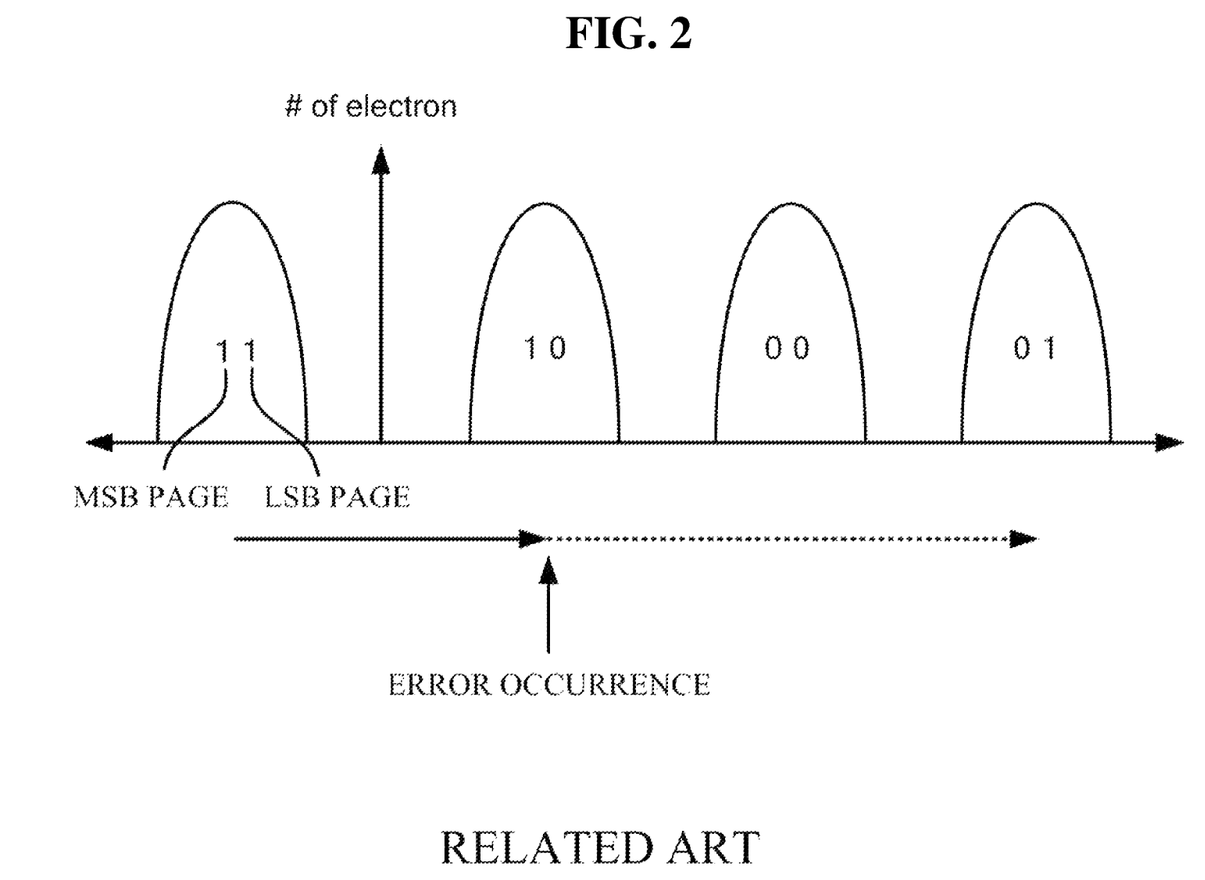
FIGS. 2 and 3 are graphs illustrating errors occurring during data write to the MSB page shown in FIG. 1.
Figure 3:
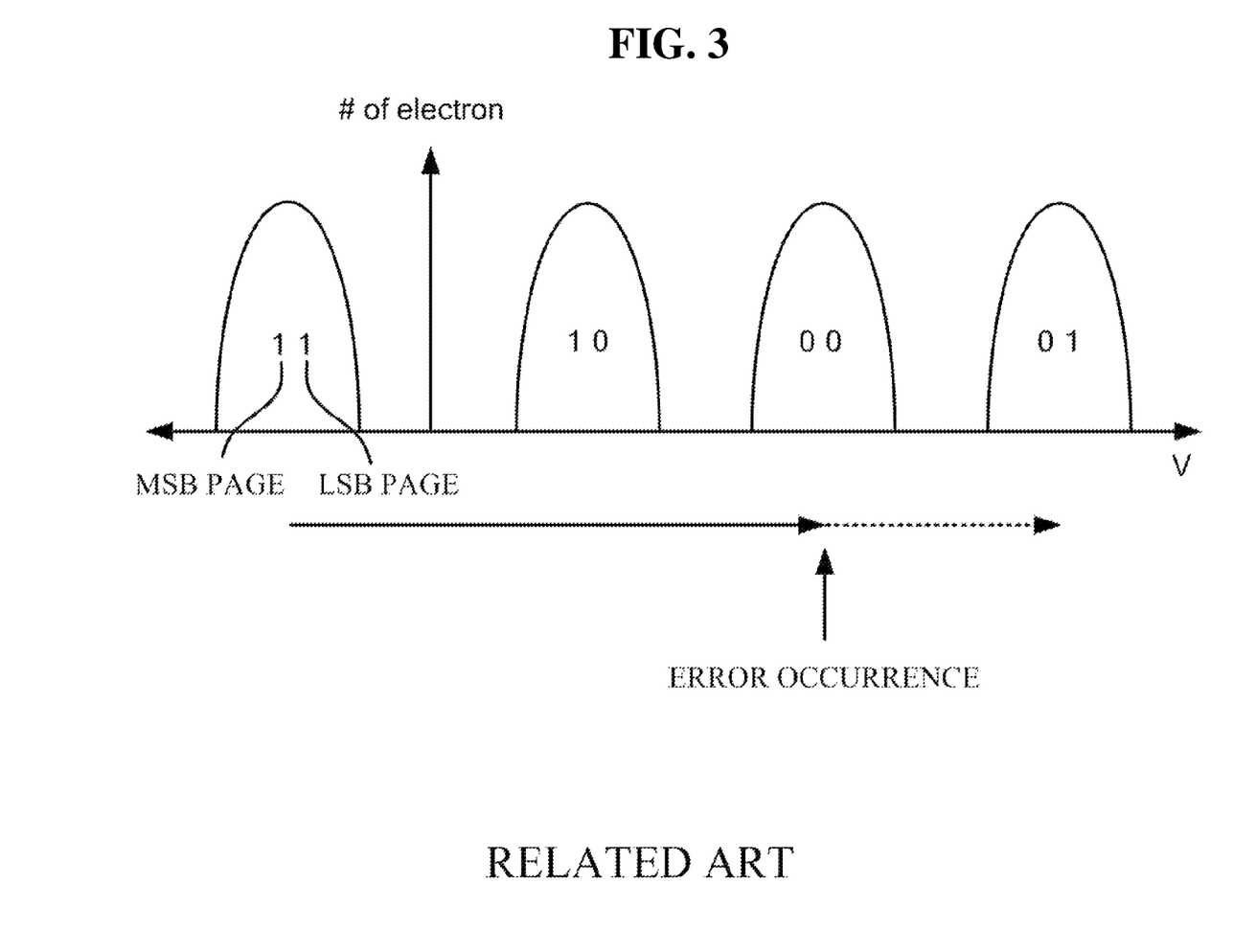

In order to make a state transition from 11 to 01 as previously described in FIG. 1, while data is written into the MSB page, an error can occur in the MSB page as shown by FIGS. 2 and 3, and one state of the LSB page can still be changed to 0. Although data is correctly written into the LSB page, the data loss of the LSB page can occur due to the error that occurred when data is written to the MSB page.

In the flash memory management method disclosed by Korean Patent 2002-0092487A, when a write to a page which stores valid data is requested, the write occurs in the log block corresponding the data block including the page. When another write is requested, the write is written to a free page in the log block. However, this patent does not provide a method to prevent data loss in the LSB page which shares memory cells due to an error occurring during data write to the MSB page in an MLC flash memory.

SUMMARY OF THE INVENTION

Exemplary embodiments of the present invention overcome the above disadvantages and other disadvantages not described above. Also, the present invention is not required to overcome the disadvantages described above, and an exemplary embodiment of the present invention may not overcome any of the problems described above.

The present invention provides an apparatus to prevent data loss of a nonvolatile memory; specifically, in a MLC nonvolatile memory that can prevent data loss of a LSB page due to an error in the MSB page.

The present invention also provides a method to prevent data loss of a nonvolatile memory, specifically in a MLC nonvolatile memory, that can prevent data loss of a LSB page due to an error in the MSB page.

The present invention should not be construed as being limited to the above objects, and the above stated objects as well as other objects, features and advantages, of the present invention will become clear to those skilled in the art upon review of the following description.

According to one aspect of the invention, there is provided an apparatus to prevent data loss in a nonvolatile memory device, the apparatus comprising a nonvolatile memory comprising a memory cell which writes bit information to a first page and a second page included in a first block using plural states which are implemented using at least 2 bits, and a data-processing unit which writes the bit information of the first page to a second block in the nonvolatile memory while the bit information is written to the second page after the bit information is written to the first page.

According to another aspect of the invention, there is provided a method to prevent data loss in a nonvolatile memory device, the method comprising writing data to a first page in a nonvolatile memory comprising a memory cell which writes bit information to a first page and a second page included in a first block using plural states implemented using at least 2 bits, and writing the data of the first page to a second block of the nonvolatile memory during data writing to the second page after the data is written to the first page.

BRIEF DESCRIPTION OF THE DRAWINGS

The above and other aspects of the present invention will become apparent by describing in detail exemplary embodiments thereof with reference to the attached drawings in which.

DETAILED DESCRIPTION OF THE INVENTION

Advantages and features of the present invention and methods of accomplishing the same may be understood more readily by reference to the following detailed description of the exemplary embodiments and the accompanying drawings. The present invention may, however, be exemplarily embodied in many different forms and should not be construed as being limited to the exemplary embodiments set forth herein. Rather, these exemplary embodiments are provided so that this disclosure will be thorough and complete and will fully convey the concept of the invention to those skilled in the art, and the present invention will only be defined by the appended claims. Like reference numerals refer to like elements throughout the specification.

Hereinafter, the present invention is described by referring to block diagrams and flow charts which explain the exemplary embodiments of the apparatus and the method to prevent data loss of a nonvolatile memory. Here, each block of the flow charts and combinations of the flow charts can be executed using computer program instructions. Since such computer program instructions can be loaded into a personal computer, a customized computer, and other processors of data processing devices which can be programmed, the instructions executed by a computer or a processor of a data processing device which can be programmed can serve as a means to execute the functionality described in the blocks of the flow charts. Such computer program instructions can be loaded into a computer to implement a function in a specific manner. Also such computer program instructions can be loaded on a memory that can be used or read by a computer or a computer that includes a programming data processing device.

The instructions stored in a memory that can be used or read by a computer can be used to produce a manufacturing product including the instructions that executes the functionality described in the flow blocks. Since computer program instructions can be loaded on a computer or other programmable data processing devices, instructions executed in a computer or other programmable data processing device can provide steps to execute functionalities described in the flow blocks.

Also, each block can represent a module, a segment, or a part of code that includes more than one instruction that executes a specific logic functions. Note that in some examples of alternative executions functions mentioned in blocks can be executed out of order. That is, adjacent two blocks can be executed in parallel, or they can be executed in reverse order depending on the functionality of each of the blocks.

Figure 4:
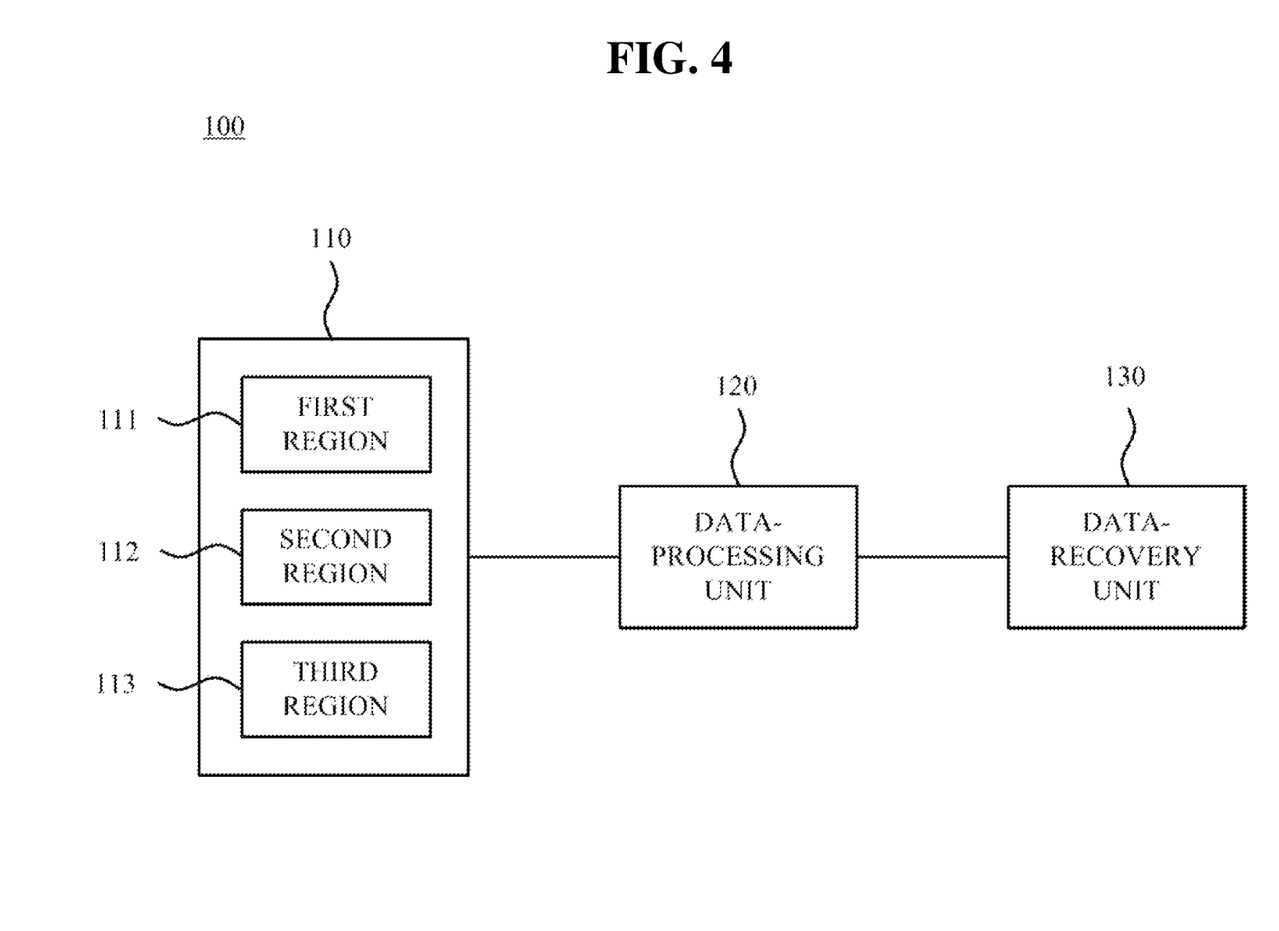
FIG. 4 is a block diagram illustrating an apparatus to prevent data loss of a nonvolatile memory according to an exemplary embodiment of the present invention.

FIG. 4 is a block diagram illustrating an apparatus to prevent data loss of a nonvolatile memory according to the exemplary embodiment of the present invention.

As shown in FIG. 4, an apparatus 100 to prevent data loss of a nonvolatile memory according to an exemplary embodiment of the present invention can include a nonvolatile memory 110, a data-processing unit 120, and a data-recovery unit 130.

The nonvolatile memory 110 is an MLC nonvolatile memory, which includes a memory cell to store data in multiple pages using multiple states implemented by at least two bits, is used as an example.

For example, when a memory cell in the MLC nonvolatile memory stores data of multiple pages using two bits, the pages that store data bits using the same memory cell are called binded pages. A memory cell can store data in the binded least significant bit (LSB) page and the most significant bit (MSB) page among the pages included in a certain block. Thus, the LSB page and the MSB can be located in a random fashion. Although the exemplary embodiment of the present invention provides an example where data bits are stored using four states, which can be implemented using a two bit memory cell, it should be considered as an example to aid understanding of the present invention, and data bits can be stored in the multiple pages using the multiple states which can be implemented using more than two bits.

Figure 5:
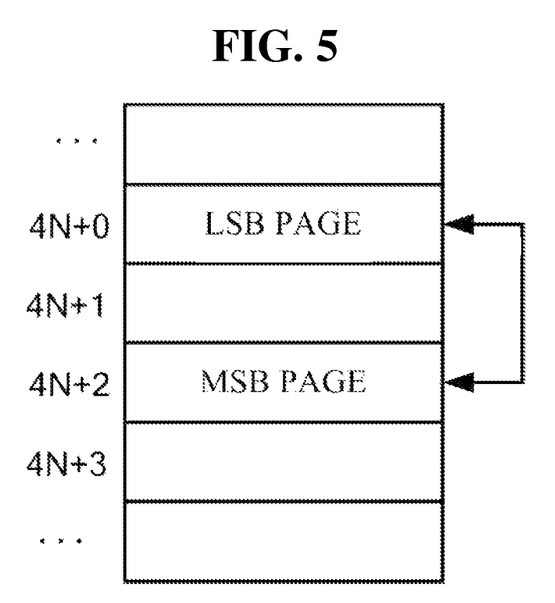
FIG. 5 is a block diagram illustrating the LSB page and the MSB page according to the exemplary embodiment of the present invention.

For example, in case of a two level MLC nonvolatile memory where memory cells stores data into multiple pages using 2 bits, as shown in FIG. 5, the identical memory cell is used for a (4N+0)th page and a (4N+2)th page. In this case, the LSB page is the (4N+0)th page and the MSB page is the (4N+2)th page.

Also, the nonvolatile memory 110 according to the exemplary embodiment of the present invention can include a first region 111 that stores data, a second region 112 where the data stored in the first region 111 is stored by the data-processing unit 120 described in the following section, and a third region 113 including free blocks. Here, the first region 111, the second region 112, and the third region 113 can include at least one block.

The data-processing unit 120 stores data into the first region 111 of the nonvolatile memory 110. Since the MLC nonvolatile memory is used as an example of the nonvolatile memory 110 according to the exemplary embodiment of the present invention, the data-processing unit 120 stores data in the LSB page corresponding to one memory cell, and then stores data in the MSB page, which shares the memory cell with the LSB page.

The data-processing unit 120 determines whether the page to be written to is the LSB or the MSB page. If the page being written is the LSB page, data is written to the page. If the page being written is the MSB page, data stored in the binded LSB page is stored in the second region of the nonvolatile memory 110.

As described above, when the data-processing unit 120 writes data to the MSB page, the data stored in the binded LSB page, which is not to be written, is stored in the second region 112. This is to prevent data loss in the binded LSB page which can occur during the data write into the binded MSB page.

In more detail, in order to change the state of a memory cell from 11 to 01, when an error occurs during the memory cell state transition from 11 to 10, the data bit of the LSB page changes to 0 from the correct value of 1. Also, when an error occurs during the memory cell state transition from 11 to 00, the data bit of the LSB page changes to 0 from the correct value of 1.

Therefore, according to the exemplary embodiment of the present invention, when the data-processing unit 120 writes data into the MSB page, the data-processing unit 120 writes data stored in the binded LSB page into the second region 112 of the nonvolatile memory 110. This is to prevent data loss of the other page that can be caused by an error occurred during data write into one of the binded pages in the MLC nonvolatile memory that shares a memory cell.

Also, since the data-processing unit 120 writes data stored in the LSB page into the second region 112 in the nonvolatile memory 110 where data can be maintained, data can be safely recovered in a situation where a voltage supply is suddenly off.

The data-recovery unit 130 can recover data when an error occurs during a write to one of the binded LSB and MSB pages by the data-processing unit 120.

In more detailed descriptions, when an error occurs during data write into the binded LSB page, the data-recovery unit 130 copies valid pages in the corresponding LSB page into a free block allocated in the third region 113.

Also, when an error occurs during data write into the binded MSB page, the valid page in the MSB page is copied into a free block allocated from the third region 113 and the binded LSB page is copied into a free block allocated from the second region 112 by the data-recovery unit 130. When the data-processing unit 120 writes data into the MSB page, the data stored into the binded LSB page is written into the second region 112. Therefore, data stored in the binded LSB page can be safely recovered in the case of an error in the MSB page.

Figure 6:
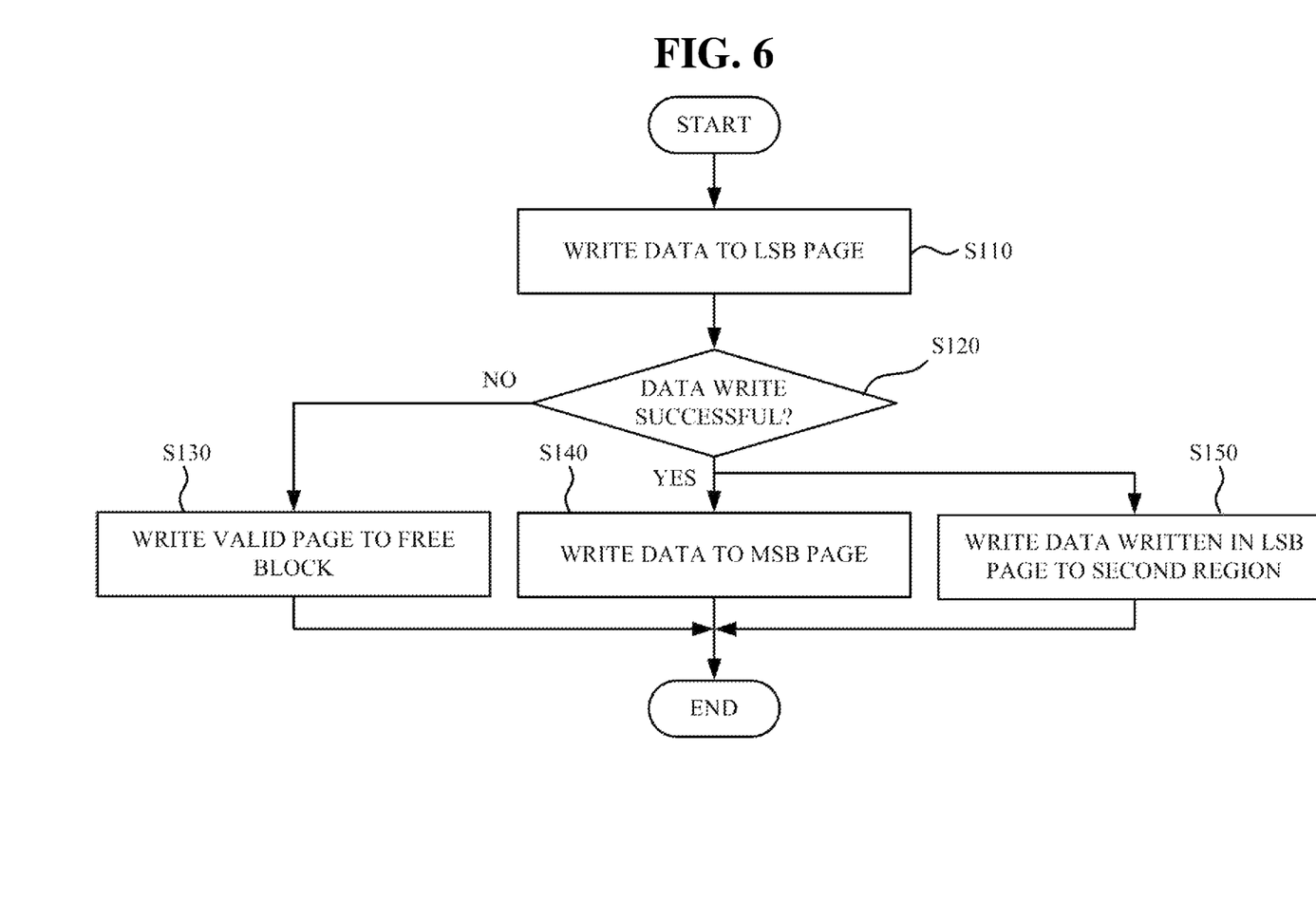
FIG. 6 is a flow chart illustrating a method to write data to a nonvolatile memory according to an exemplary embodiment of the present invention.

FIG. 6 is a flow chart illustrating a method to write data into a nonvolatile memory according to an exemplary embodiment of the present invention. The method to write data shown in FIG. 6 is explained with the assumption that a write to a nonvolatile memory is requested by a user.

As shown in FIG. 6, the data write method according to the exemplary embodiment of the present invention includes the first operation where a data-processing unit 120 writes data into a certain LSB page S110. In this operation, the LSB page which is written by the data-processing unit 120 can be pre-determined or random.

The data-processing unit 120 decides if an error has occurred during writing data to the LSB page S120, and copies the valid data in the corresponding LSB page to the free block allocated in a third region 113 of the nonvolatile memory 110 if there is an error S130. If the data write is successful, data is written to the MSB page, which is binded with the LSB page in the S110 operation S140.

In this operation, the data-processing unit 120 writes data into the MSB page. At the same time, it writes data written into the LSB page in operation S110 into a block in a second region 112 of the nonvolatile memory 110.

As described above, the data-processing unit 120 writes data stored in the binded LSB page into the second region 112 during data write into the MSB page to prevent data loss of the LSB page containing correct data during the MSB page write.

Figure 7:
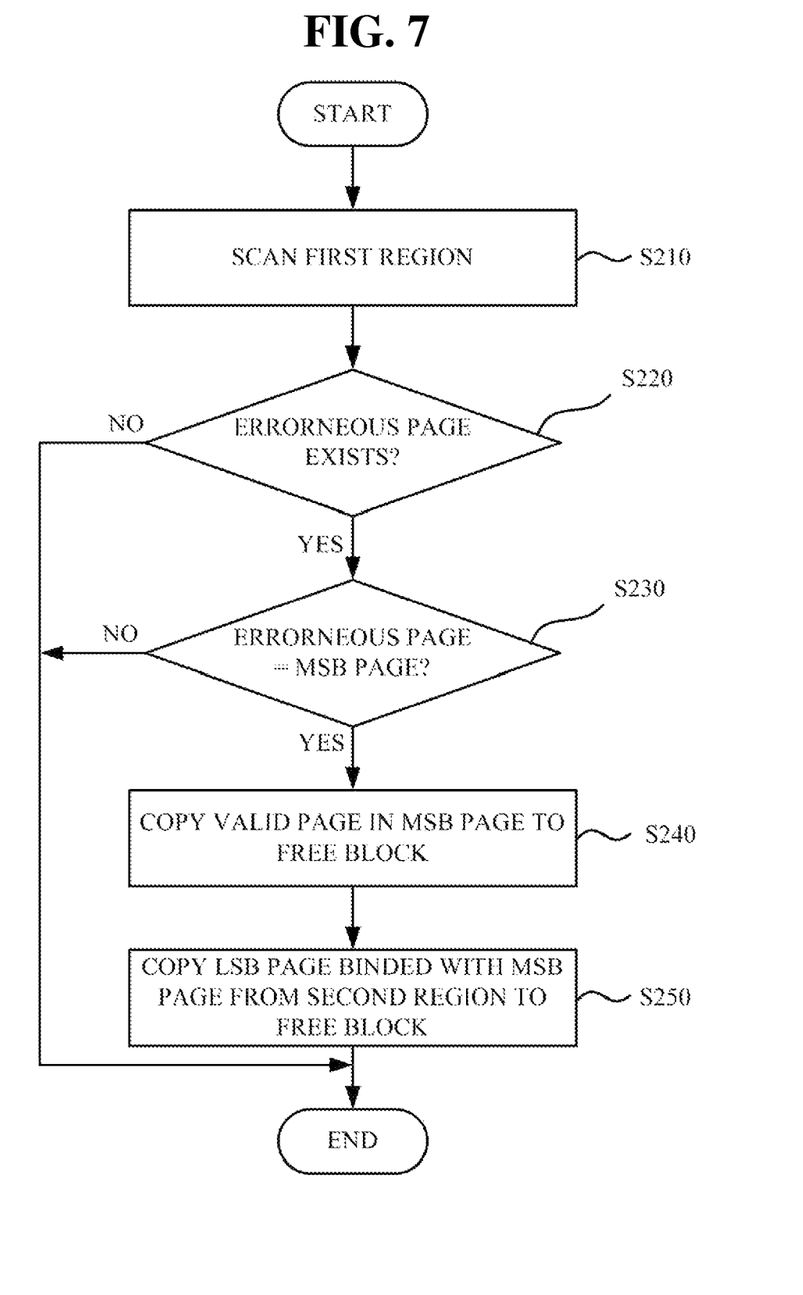
FIG. 7 is a flow chart illustrating a method to recover data from a nonvolatile memory according to an exemplary embodiment of the present invention.

FIG. 7 is a flow chart illustrating a data recovery method in a nonvolatile memory according to an exemplary embodiment of the present invention. The data recovery method shown in FIG. 7 can be understood as a method to recovery data after the voltage supply is cut during data write to the nonvolatile memory.

As shown in FIG. 7, the data recovery method according to the exemplary embodiment of the present invention includes the first step where a data-recovery unit 130 scans a first region 111 of the nonvolatile memory 110 S210.

After data scanning, the data-recovery unit 130 decides if there is a page that contains an error. If it finds the page with the error S220 it decides if the page with the error is a MSB page S230. In this operation, the data-recovery unit 130 can decide the page with an error using a mark value stored at the end of the data write into the corresponding page, however, since this can be an example to aid understanding of the present invention it is not limited to such method.

If the error occurs in the MSB page, the data-recovery unit 130 copies a valid page to a predetermined free block allocated in a third region 113 S240, and recovers the data in the LSB page, which shares the memory cell with the MSB page having the error by copying the data in a second region 112 S250. The recovery data for the LSB page is copied from the second region 112 because as described in FIG. 6 the binded LSB page data is copied to the second region 112 during writing of the MSB page data.

Therefore, the device and the method to prevent data loss in a nonvolatile memory according to the exemplary embodiments of the present invention can prevent data loss in one page that can be caused by an error occurring during data write to one of the pages that shares a memory cell. Also, only the LSB page can be used to prevent data loss in the LSB page due to the MSB page error, however, this method only utilizes half of the nonvolatile memory space. Thus, with the reuse of the second region the present invention achieves close to 100% utilization of the nonvolatile memory space.

The second region 112 can be used to store only particular data rather than to store an entire page. In this case, overhead to store the LSB page data to the second region 112 can be reduced.

The terminology "unit" used in the exemplary embodiments of the present invention represents a hardware component including a Field Programmable Gate Array (FPGA) and an Application Specific Integrated Circuit (ASIC) and executes particular operations. However, the terminology "unit" is not limitative to hardware or software. The unit can be constructed to be stored into addressable storage device or can be constructed to execute one or more processors. For example, the unit can include software components, object oriented software components, class components, and task components. The unit also can include processes, functions, attributes, procedures, subroutines, segments of program codes, drivers, firmware, microcode, circuit, data, database, data structures, tables, arrays, and variables. Functions provided by components and units can be combined into smaller number of components and units or can be further divided into additional components and units.

While the present invention has been particularly shown and described with reference to exemplary embodiments thereof, it will be apparent to those skilled in the art that the scope of the invention is given by the appended claims, rather than the preceding description, and all variations and equivalents which fall within the range of the claims are intended to be embraced therein. Therefore, it should be understood that the above embodiments are not limitative, but illustrative in all aspects.

As described above, according to the apparatus and the method to prevent data loss in a nonvolatile memory of the present invention, one or more than one of the following effects can be observed.

In the MLC nonvolatile memory the LSB page data is stored in another region, which prevents data loss in the LSB page due to the MSB page error.

Also, in case of the MLC nonvolatile memory, the MLC nonvolatile memory utilization can be improved since the data loss in the LSB page due to the MSB page error can be avoided.

What is claimed is:

1. An apparatus to prevent data loss in a nonvolatile memory device, comprising:
a nonvolatile memory comprising a memory cell which writes bit information to a first page and a second page included in a first block using plural states which are implemented using at least 2 bits; and
a data-processing unit which writes the bit information of the first page to a second block in the nonvolatile memory while the bit information is written to the second page after the bit information is written to the first page,
wherein the nonvolatile memory is partitioned into at least three regions in which the first block belongs to a first region, the second block belongs to the second region, and the third region comprises at least one third block which stores a copy of the first page written to the second block in the nonvolatile memory.

2. The apparatus of claim 1, wherein the first page is a least significant bit (LSB) page and the second page is a most significant bit (MSB) page.

3. The apparatus of claim 1, wherein the nonvolatile memory represents the bit information of the first page and the second page using four states which are implemented using 2 bits.

4. The apparatus of claim 1, wherein the data-processing unit writes data if the page to be written is the first page, and the data-processing unit writes data written to the first page to the second block if the page being written is not the first page.

5. The apparatus of claim 4, wherein the data-processing unit copies an existing valid page to a free block in the nonvolatile memory when an error occurs during data write to the first page.

6. The apparatus of claim 1, further comprising a data-recovery unit which recovers the data of the nonvolatile memory using the data written to the second block.

7. The apparatus of claim 6, wherein the data-recovery unit scans the first block of the nonvolatile memory, and determines, if the page contains an error, which page is the page with an error between the first page and the second page.

8. The apparatus of claim 7, wherein the data-recovery unit copies a valid page of an existing block to a free block in the nonvolatile memory, and copies the first page from the second block to the free block if the page with the error is the second page.

9. The apparatus according to claim 1, wherein the nonvolatile memory comprises only multi-level cells.

10. The apparatus according to claim 1, wherein the nonvolatile memory comprises only cells in which states are represented with at least two bits.

11. The apparatus according to claim 1, wherein the data processing unit copies a valid page to the second region of the nonvolatile memory when error occurs and wherein the data processing unit stores recovered pages along with the corresponding valid page stored in the second region in the third region and wherein the third region has free blocks.

12. The apparatus according to claim 1, wherein the data processing unit writes the bit information of the first and second pages into the first region of the nonvolatile memory, wherein the second region is a backup region comprising blocks for copying the bit information written in the first region, and wherein the third region comprises free blocks.

13. A method to prevent data loss in a nonvolatile memory device, comprising:
writing data to a first page in a nonvolatile memory comprising a memory cell which writes bit information to a first page and a second page included in a first block using plural states implemented using at least 2 bits; and
writing the data of the first page to a second block of the nonvolatile memory during data writing to the second page after the data is written to the first page,
wherein the nonvolatile memory is partitioned into at least three regions in which the first block belongs to a first region, the second block belongs to the second region, and the third region comprises at least one third block which stores a copy of the first page written to the second block in the nonvolatile memory.

14. The method of claim 13, wherein the first page is a least significant bit (LSB) page and the second page is a most significant bit (MSB) page.

15. The method of claim 13, wherein the nonvolatile memory represents the bit information of the first page and the second page using four states implemented using 2 bits.

16. The method of claim 13, wherein writing the data of the first page to the second block includes writing the data if the page to be written is the first page, and writing the data written in the first page to the second block if the page being written is not the first page.

17. The method of claim 16, wherein writing the data written in the first page to the second block includes copying an existing valid page to a free block in the nonvolatile memory when an error occurs during data write to the first page.

18. The method of claim 13, further comprising recovering data of the nonvolatile memory using the data written to the second block.

19. The method of claim 18, wherein the recovering data includes scanning a data block in the nonvolatile memory and determining, if the page contains an error, which of the first page and the second page contains the error.

20. The method of claim 19, wherein the recovering data includes copying a valid page of an existing block to a free block in the nonvolatile memory and copying the first page from the second block to the free block if the page with the error is the second page.

* * * * *